US006789209B1

United States Patent
Suzuki et al.

(10) Patent No.: US 6,789,209 B1
(45) Date of Patent: Sep. 7, 2004

(54) SEMICONDUCTOR INTEGRATED CIRCUIT DEVICE

(75) Inventors: Takaaki Suzuki, Kawasaki (JP); Yasuharu Sato, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 609 days.

(21) Appl. No.: 09/615,952

(22) Filed: Jul. 13, 2000

(30) Foreign Application Priority Data

Oct. 8, 1999 (JP) .......................................... 11-288774

(51) Int. Cl.$^7$ .............................................. G06F 1/04
(52) U.S. Cl. ...................................... 713/401; 713/503
(58) Field of Search ................................ 713/400, 401, 713/500, 503, 600

(56) References Cited

U.S. PATENT DOCUMENTS

| | | | | |
|---|---|---|---|---|
| 5,726,588 A | * | 3/1998 | Fiedler | 326/63 |
| 6,029,250 A | * | 2/2000 | Keeth | 713/400 |
| 6,088,829 A | * | 7/2000 | Umemura et al. | 714/798 |
| 6,374,360 B1 | * | 4/2002 | Keeth et al. | 713/400 |
| 6,446,180 B2 | * | 9/2002 | Li et al. | 711/167 |
| 6,480,946 B1 | * | 11/2002 | Tomishima et al. | 711/167 |
| 6,510,503 B2 | * | 1/2003 | Gillingham et al. | 711/167 |

* cited by examiner

*Primary Examiner*—Dennis M. Butler
(74) *Attorney, Agent, or Firm*—Arent Fox, PLLC

(57) ABSTRACT

In a semiconductor integrated circuit device operating in synchronism with a clock supplied from the outside of the device, there is provided a circuit generating, from the clock, an output strobe signal for outputting data from the device and outputting the output strobe signal to the outside of the device.

12 Claims, 15 Drawing Sheets

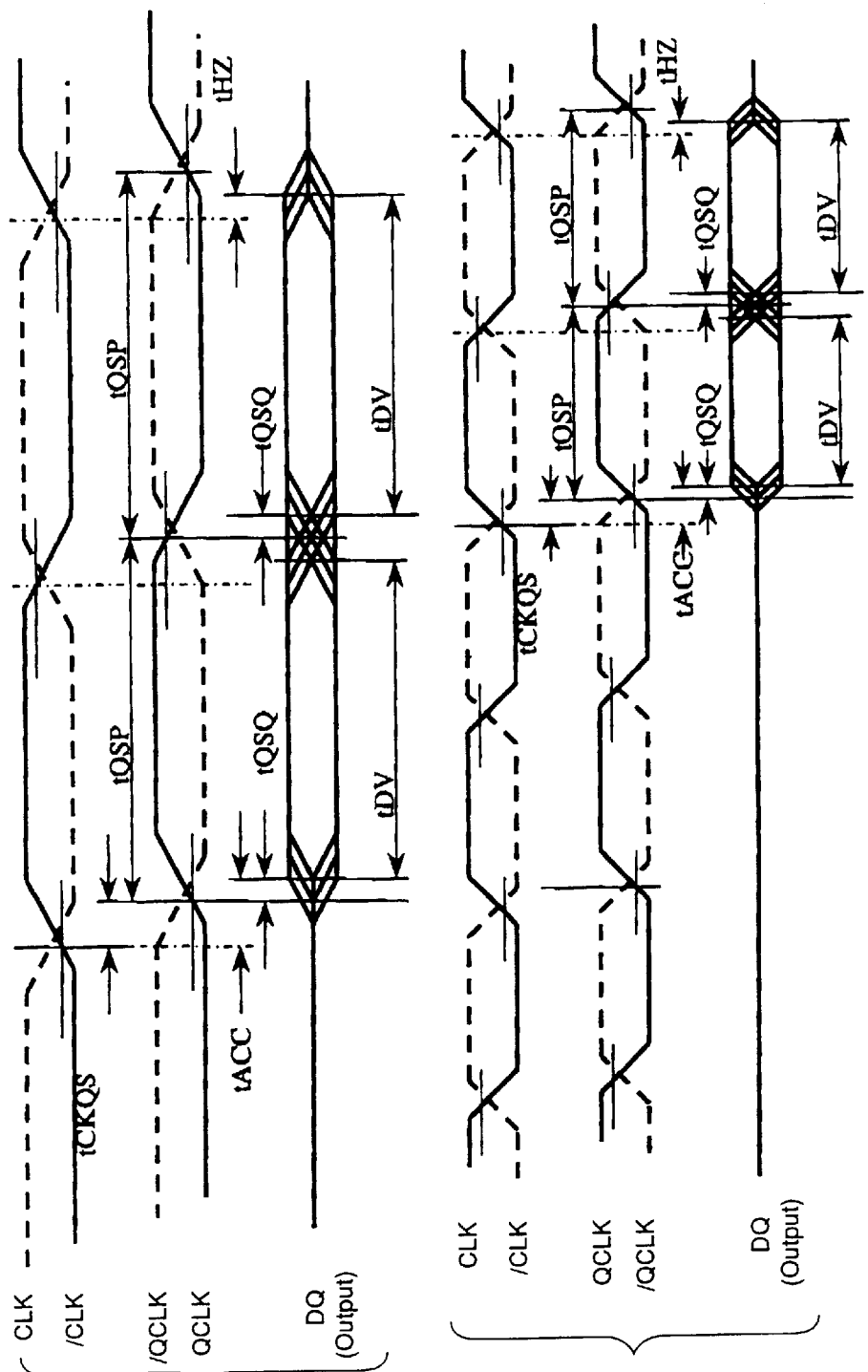

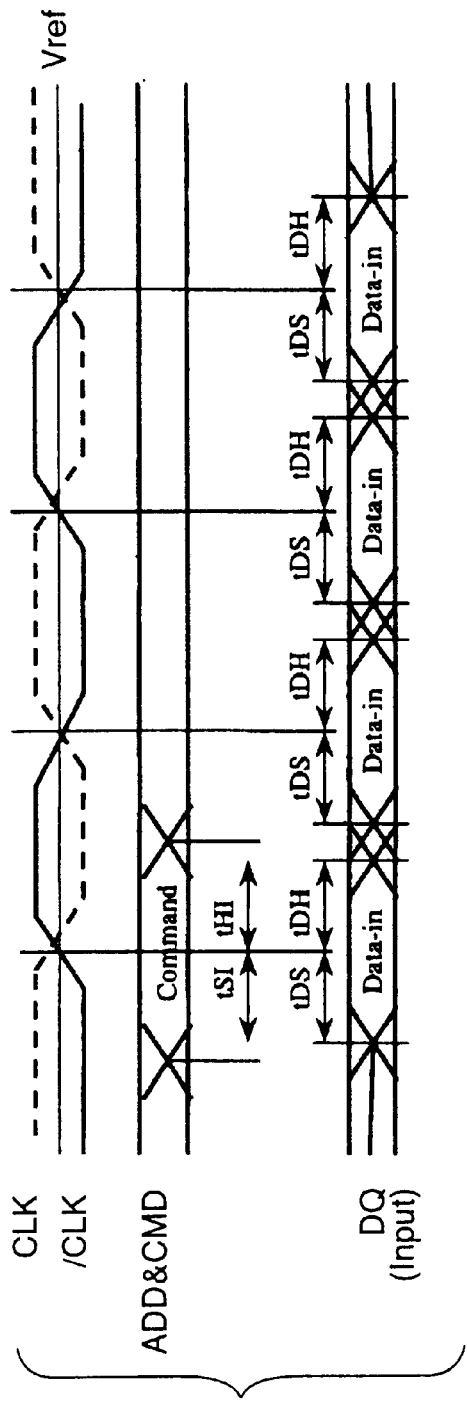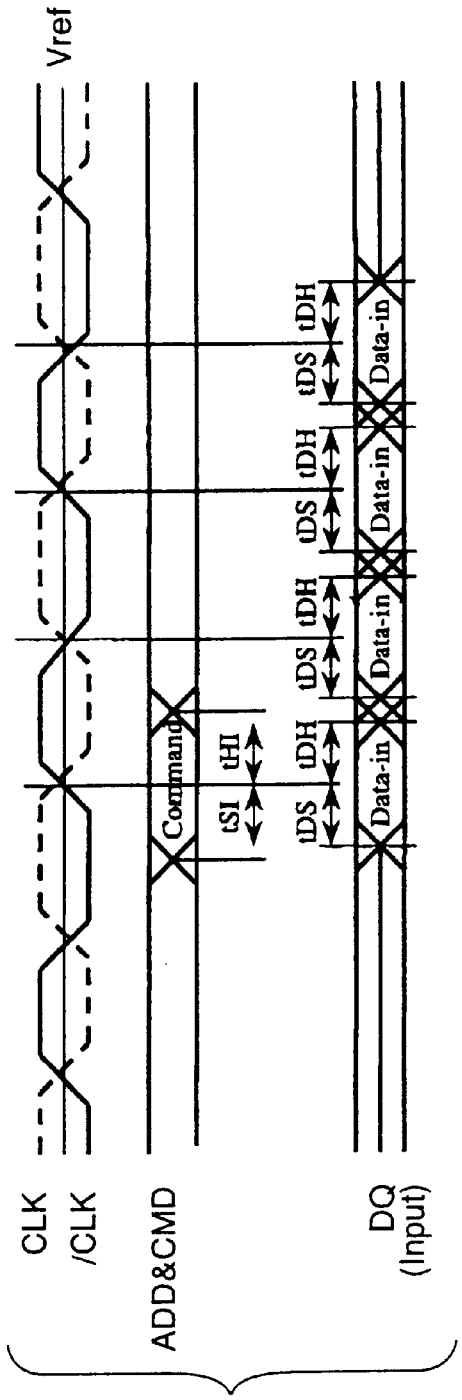

SEMICONDUCTOR INTEGRATED CIRCUIT DEVICE

BACKGROUND OF THE INVENTION

1. Field of the Invention

The present invention generally relates to semiconductor integrated circuit devices, and more particularly to a semiconductor memory device that operates in synchronism with a clock supplied from the outside of the device.

Conventionally, semiconductor memory devices such as DRAM devices were researched and developed in such a way as to increase the integration density. Recently, CPUs and microprocessors have been advanced to operate at high speeds and it has thus been required to improve the data transfer rate. As semiconductor memory devices which meet the above requirement, various types of semiconductor memory devices have been proposed and placed in practice. Examples of such memory devices are an SDRAM (Synchronous Dynamic Random Access Memory), an FCRAM (Fast Cycle RAM), and a DDR-SDRAM (Double Data Rate SDRAM). Of these types of devices, the DDR-SDRAM utilizes both the rising and falling edges of the clock, so that the data transfer rate can be doubled. Also, the DDR-SDRAM uses a data strobe signal, which ensures a sufficient margin to settle data.

2. Description of the Related Art

FIG. 1 is a block diagram of a system including a controller 100 such as a CPU, and a DDR-SDRAM 200 (hereinafter simply referred to as a memory). FIG. 2 is a timing chart of an operation of the system.

The controller 100 and the memory 200 operate in response to clocks CLK and /CLK of a differential or complementary fashion generated by a clock generator (not shown). Data DQ is transferred between the controller 100 and the memory 200 along with a data strobe signal DQS. The memory 200 is equipped with a terminal DQS used to receive and send the data strobe signal DQS. The controller 100 outputs a command CMD to the memory 200, which is thus instructed to perform a data read (output) operation or a data write (input) operation. An address signal which is output to the memory 200 by the controller 100 is omitted for the sake of simplicity.

A description will be given, with reference to FIG. 2, of the data read and write operations of the system. The controller 100 sends a read command RDAa to the memory 200, which then acquires the command RDAa in synchronism with a rising edge of the clock CLK (timing of "0" shown in FIG. 2). The memory 200 switches the data strobe signal DQS from a low level L to a high level H at a timing of "2", which lags behind the receipt of the read command RDAa by two cycles.

The controller 100 and the memory 200 commonly use the data strobe signal DQS with regard to the data input and output operations. Thus, it is necessary for the data strobe signal DQS to be at the low level L for a period that is one cycle earlier than the cycle in which data is read from the memory 200. Such a period is called a preamble period. When data read from the memory 200 is output to a data bus, the memory 200 changes the data strobe signal DQS from the low level L to the high level H. Thus, read data Qa1 is output from the memory 200 to the data bus in synchronism with the rising edge of the data strobe signal DQS.

After the memory 200 switches the data strobe signal DQS to the high level H, the memory 200 alternately changes the data strobe signal DQS to the high level H and the low level L. In synchronism with each of the rising and falling edges of the data strobe signal DQS, pieces of data Qa1, Qa2, Qa1 and Qa2 are serially output to the data bus.

After the pieces of data are output to the data bus, the memory 200 sets a signal line over which the data strobe signal DQS is transferred to a high-impedance state Hi-Z. Thus, it is possible to prevent the data strobe signal DQS output by the memory 200 from interfering with the data strobe signal DQS output by the controller 100. The controller 100 generates an internal signal having edges which are delayed, by a given time, from the rising and falling edges of the data strobe signal DQS, and acquires the read data on the data bus.

Then, the controller 100 outputs a write command WRAb to the memory 200, and sends pieces of write data Db1, Db2, Db1 and Db2 to the memory 200. The controller 10 sets the data strobe signal DQS to the low level L so that the preamble period is defined. Then, the controller 100 alternately switches the data strobe signal DQS to the high level H and the low level L. The memory 200 acquires the pieces of write data in synchronism with the rising and falling edges of the data strobe signal DQS. Then, the controller 100 sets the data strobe signal DQS to the low level L.

In FIG. 2, "CL=2" denotes that the column latency is equal to 2, and "WL=1" denotes that the write latency is equal to 1. The system shown in FIG. 2 commonly uses the data bus with regard to the data input and output operations. Alternatively, the data input and output operations can be performed through respective, different data buses.

However, the semiconductor memory device 200 has the following disadvantages.

First, it is necessary to define the preamble period because the data strobe signal DQS is used in common to the data read (output) and write (input) operations. the controller 100 and the memory 200 are inhibited from outputting data to the data bus for the preamble period. The preamble period is an empty period, which prevents improvement in the data transfer rate.

Second, it is required that the line carrying the data strobe signal DQS output by the memory 200 is set to the high-impedance state Hi-Z after the data read operation is completed. Thus, the memory 200 must be equipped with a control circuit that sets the data strobe signal line to the high-impedance state.

Third, the data strobe signal DQS is a single-phase signal, and may have high-level and low-level periods which are not equal to each other. This results in different periods for settling or defining data. FIG. 3 shows this problem. The data strobe signal DQS shown in FIG. 3 has a low-level period longer than a high-level period. The data strobe signal DQS is compared with a reference voltage (threshold voltage) Vref, so that the high level H and the low level L are discriminated. In FIG. 3, "tQSP" denotes the pulse width of the data strobe signal DQS, and "tQSQ" denotes a data access time from the data strobe signal DQS. Also, "tDV" is a data settlement (definition) width, and "tACC" denotes a data access time from the clock CLK. Further, "tHZ" denotes the period for which the high-impedance state Hi-Z is maintained, and "tCKQS" denotes an access time from the clock CLK to the data strobe signal DQS. The situation in which the low-level period of the data strobe signal DQS shown in FIG. 3 is longer than the high-level period thereof results in different data settlement widths tDV.

SUMMARY OF THE INVENTION

It is a general object of the present invention to provide a semiconductor integrated circuit device in which the above disadvantages are eliminated.

A more specific object of the present invention is to provide a semiconductor integrated circuit device having a newly proposed data transfer method.

The above objects of the present invention are achieved by a semiconductor integrated circuit device operating in synchronism with a clock supplied from the outside of the device, the device including: a first circuit generating, from the clock, an output strobe signal for outputting data from the device and outputting the output strobe signal to the outside of the device.

The above objects of the present invention are also achieved by a semiconductor memory device including: a memory part; a clock receiving part receiving complementary clocks supplied from the outside of the device; and a first circuit generating, from the complementary clocks, complementary output strobe signals for outputting data stored in the memory part and outputting the output strobe signal to the outside of the device.

It is yet another object of the present invention to provide a system include a controller and a memory device. More particularly, the system including: a controller outputting complementary clocks; and a memory device coupled with the controller. The memory device includes: a memory part; a clock receiving part receiving the complementary clocks; and a first circuit generating, from the complementary clocks, complementary output strobe signals for outputting data stored in the memory part and outputting the output strobe signal to the controller.

BRIEF DESCRIPTION OF THE DRAWINGS

Other objects, features and advantages of the present invention will become more apparent from the following detailed description when read in conjunction with the accompanying drawings, in which:

FIGS. 10A and 10B are timing charts of data read operations of the configuration shown in FIG. 5 in which different clock frequencies are used;

FIGS. 11A and 11B are timing charts of data write operations of the configuration shown in FIG. 5 in which different clock frequencies are used;

DESCRIPTION OF THE PREFERRED EMBODIMENTS

Figure 4:
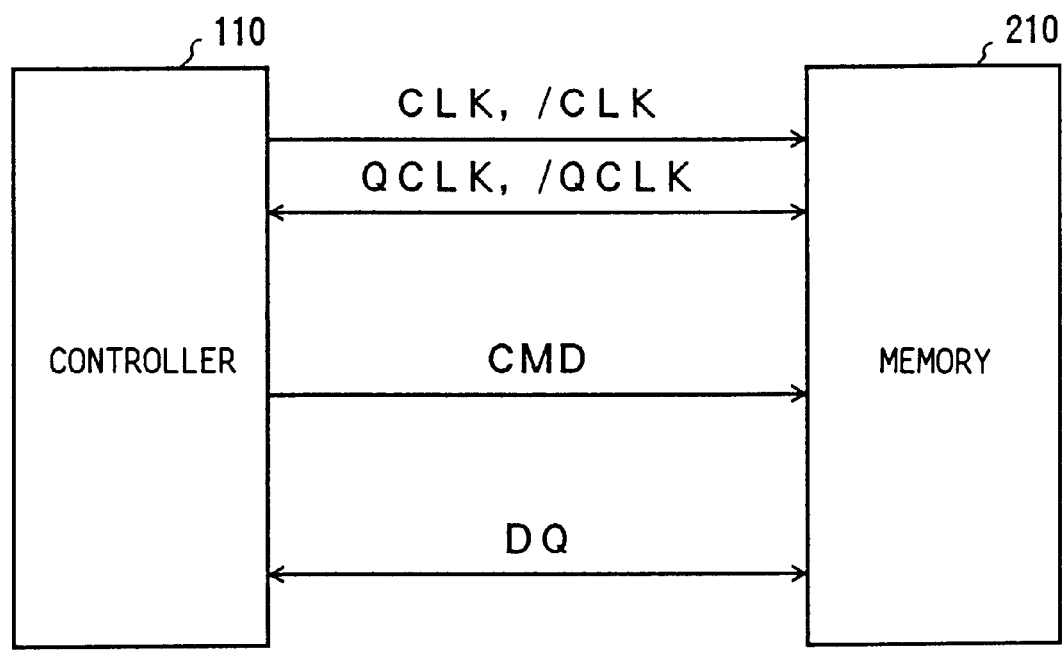
FIG. 4 is a block diagram of the principle of the present invention.

FIG. 4 is a block diagram depicting the principle of the present invention.

The present invention uses clocks CLK and /CLK and output strobe signals QCLK and /QCLK instead of the single-phase data strobe signal DQS used in the conventional system. The output strobe signals QCLK and /QCLK can be generated by, for example, buffering, in a memory 210, the clocks CLK and /CLK transferred from a controller 110.

Figure 5:
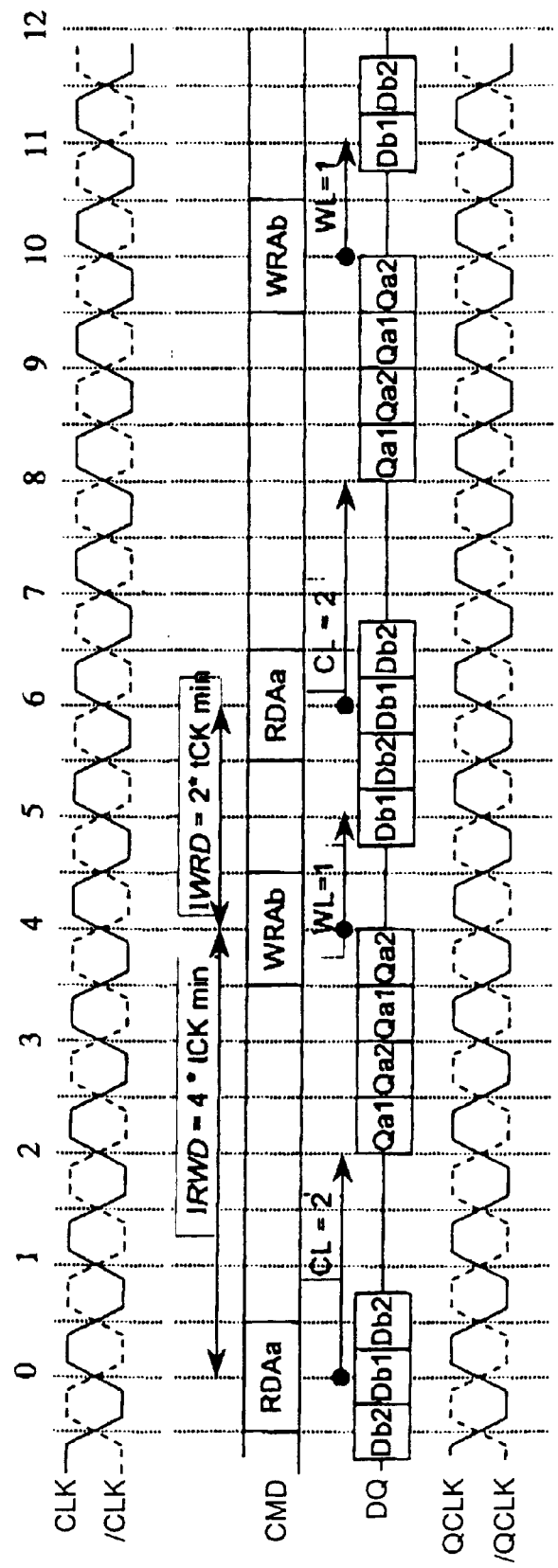
FIG. 5 is a timing chart of an operation of the configuration shown in FIG. 4.

FIG. 5 is a timing chart of an operation the system shown in FIG. 4.

Figure 1:
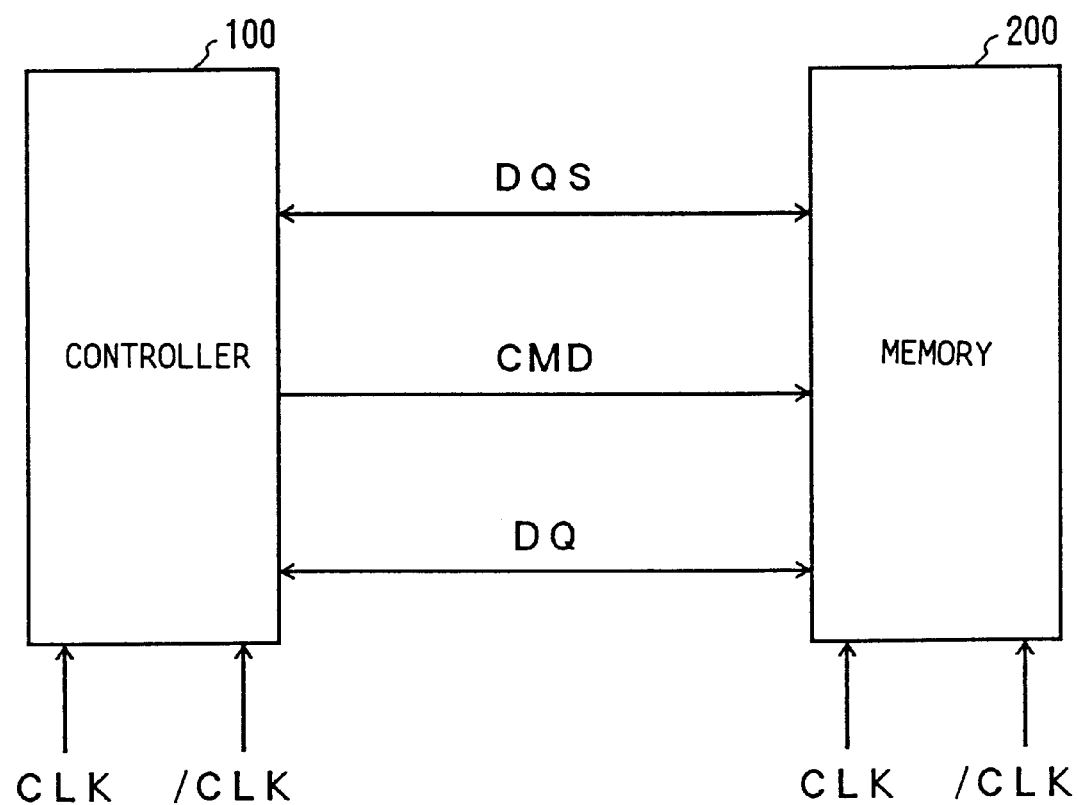
FIG. 1 is a block diagram of a system having a controller and a memory.
Figure 2:
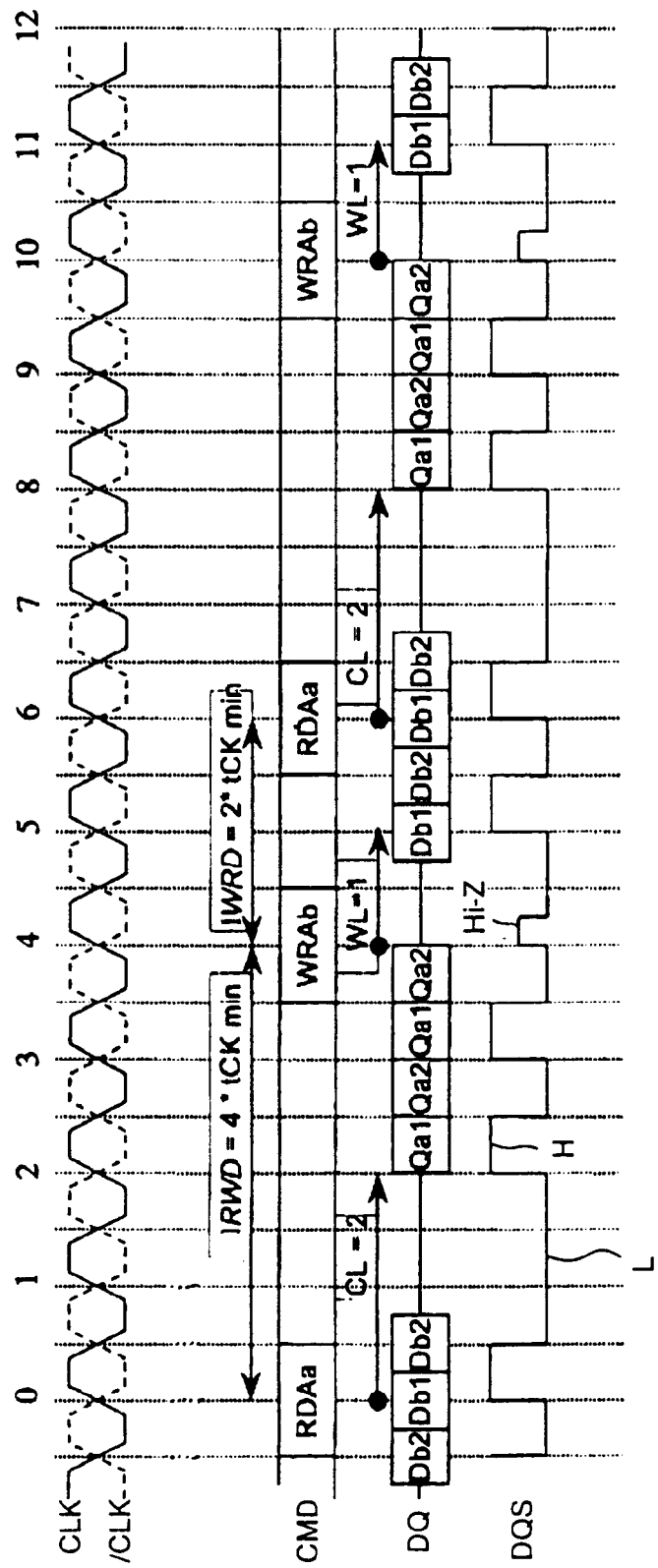
FIG. 2 is a timing chart of an operation of the system shown in FIG. 1.
Figure 3:
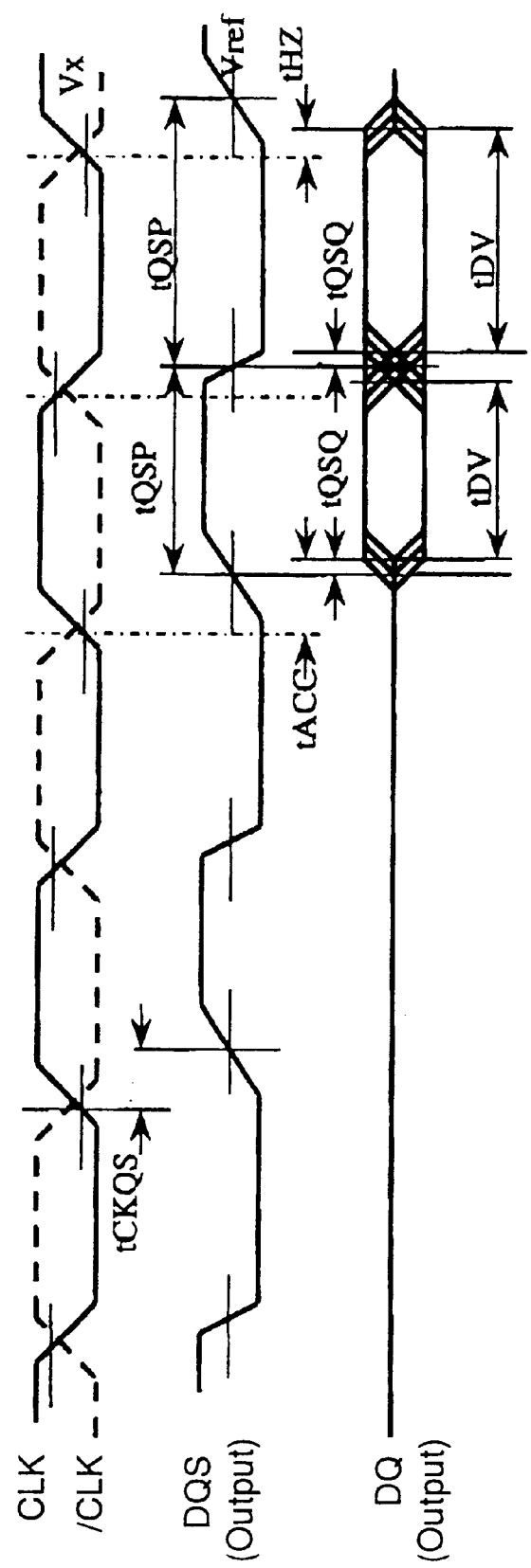
FIG. 3 is a timing chart illustrating a problem encountered in the conventional system.

The controller 110 sends a read command RDAa to the memory 210. As has been described with reference to FIG. 2, the conventional memory 100 switches the data strobe signal DQS from the low level L to the high level H two cycles after the receipt of the data strobe signal DQS. In contrast, according to the present invention, pieces of read data Qa1, Qa2, Qa1 and Qa2 are transferred to the controller 110 together with the output strobe signals QCLK and /QCLK that are differential or complementary clocks. The controller 110 detects the phase differences between the clocks CLK, /CLK generated by itself and the output strobe signals QCLK, /QCLK, and thus acknowledges a timing at which the read data is acquired.

Figure 6:
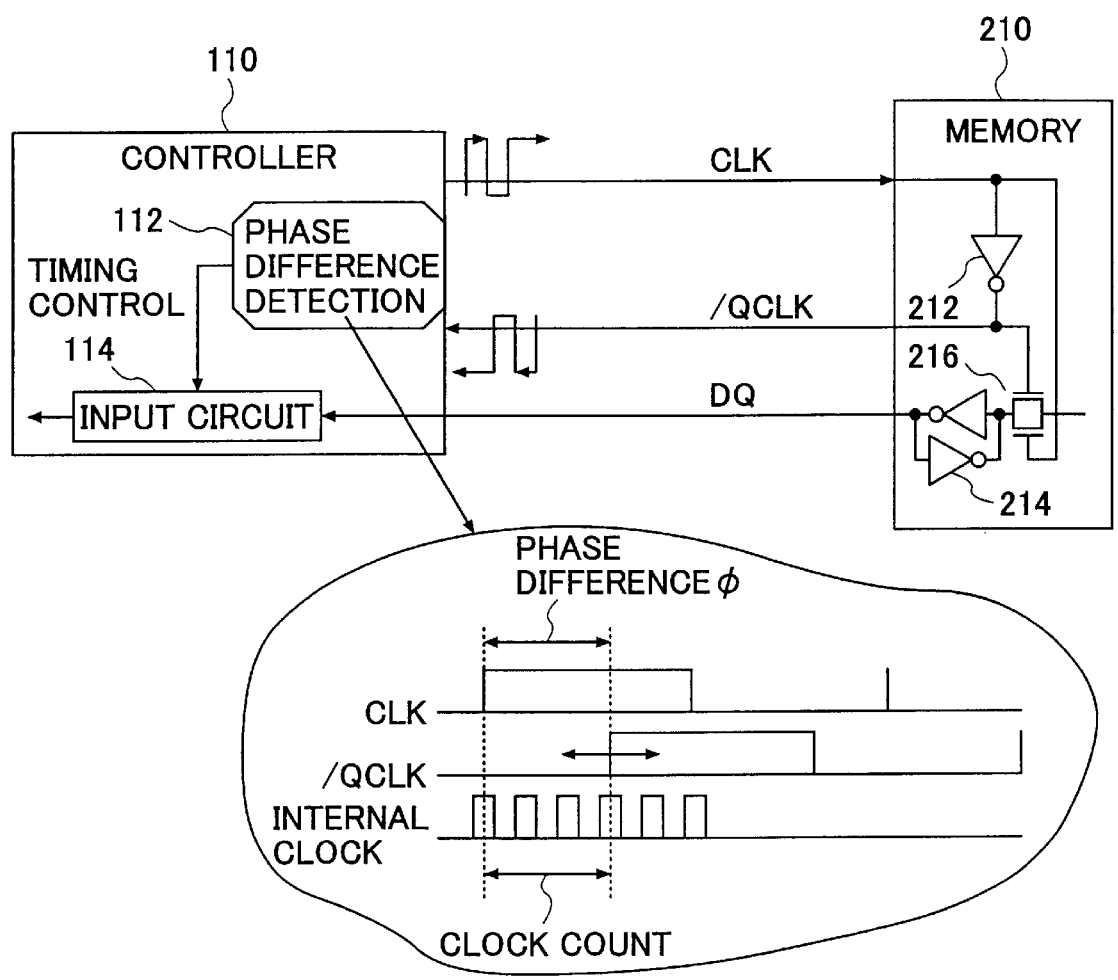
FIG. 6 is a diagram of configurations of a memory and a controller shown in FIG. 4 and a phase detection performed in the controller.

FIG. 6 is a diagram showing the above-mentioned detection of the phase difference. The controller 110 is equipped with a phase difference detection circuit 112. As shown, the phase difference detection circuit 112 compares the phase of the clock CLK output by the controller 110 with that of the output strobe signal /QCLK. This output strobe signal /QCLK is generated by buffering the clock CLk by means of a buffer circuit 212 formed of an inverter provided in the memory 210 and is transferred from the memory 210 to the controller 110. In order to detect a phase difference φ, an internal clock having a frequency higher than that of the clock CLK is used. That is, a count operation on the internal clock is initiated in synchronism with the rising edge of the clock CLK, and is stopped in response to the rising edge of the output strobe signal /QCLK. The count number thus obtained indicates the phase difference φ.

When the phase difference φ is detected, it is possible to control the timing at which the read data DQ is acquired in an input circuit 114. Data read from the memory 210 is output to a data bus DQ via an analog switch 216 and a latch 214, which are controlled by the clock CLK and the inverted clock thereof. Although not illustrated for the sake of simplicity, the memory 210 includes a buffer, which inverts the clock /CLK, the inverted signal being the output strobe signal /QCLK.

Turning to FIG. 5 again, the controller 110 sends a write command WRAb to the memory 210 after sending the aforementioned read command RDAa. The memory 210 receives only pieces of write data Db1, Db2, Db1 and Db2 and the clocks CLK and /CLK. It is to be noted that the data strobe signal DQS conventionally used is not used. Since it is known beforehand that the write latency is equal to 1, the memory 210 can expect a timing at which the first piece of write data Db1 after receiving the write command WRAb. That is, the memory 210 uses the clocks CLK and /CLK from the controller 110 as a strobe signal for write data. In other words, the write data, address and commands are all acquired in the memory 210 by using the clocks CLK and /CLK. Thus, it is possible to omit the data strobe signal DQS conventionally used.

Figure 7:
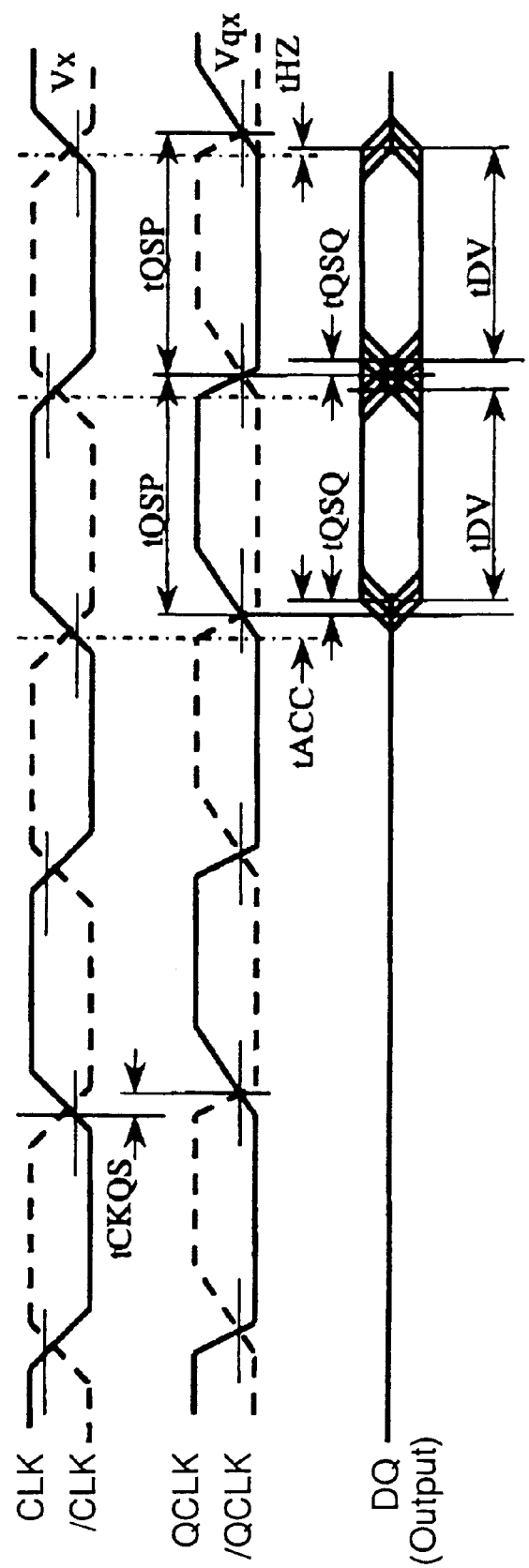
FIG. 7 is a timing chart of a data read operation of the configuration shown in FIG. 5, in which output strobe signals are deformed.
Figure 8:
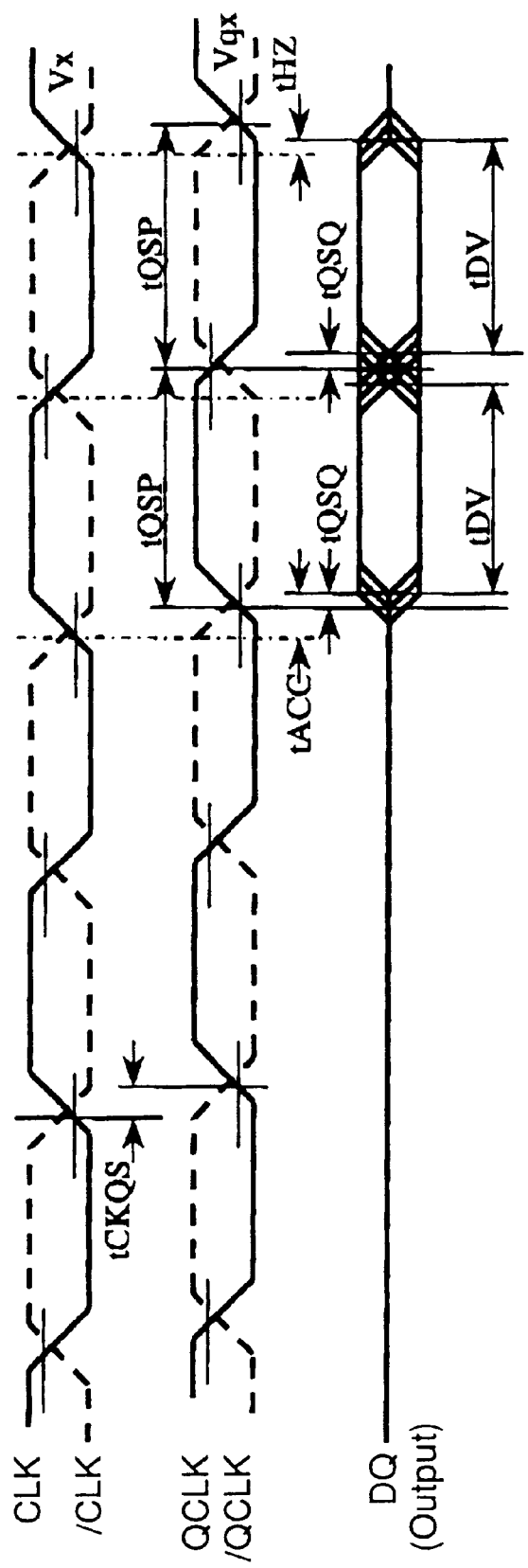
FIG. 8 is a timing chart of another data read operation of the configuration shown in FIG. 5.

As described above, according to the present invention, the strobe signal output by the memory 210 is comprised of the differential output strobe signals QCLK and /QCLK, and the controller 110 does not output the storbe signal. As long as the clocks CLK and /CLK are supplied, the output strobe signals QCLK and /QCLK are strobe signals which are dedicated to the data outputting and are always output from the memory 210. Thus, it is no longer required to employ the high-impedance control. Thus, the memory 210 does not have any circuit for the high-impedance control. In addition, there is no interference between the data strobe signals DQS respectively output from the controller 100 and the memory 200. As a result, there is no need to define the preamble period. Furthermore, since the output strobe signals QCLK and /QCLK are of differential style, as shown in FIG. 7, if a cross point of these signals is defined as a timing reference point, the data settlement width tDV can be made constant even if the output strobe signals QCLK and /QCLK have different high-level and low-level periods. Thus, the controller 110 can acquire read data easily. FIG. 8 shows the output strobe signals QCLK and /QCLK have the equal high-level and low-level periods.

Figure 9:
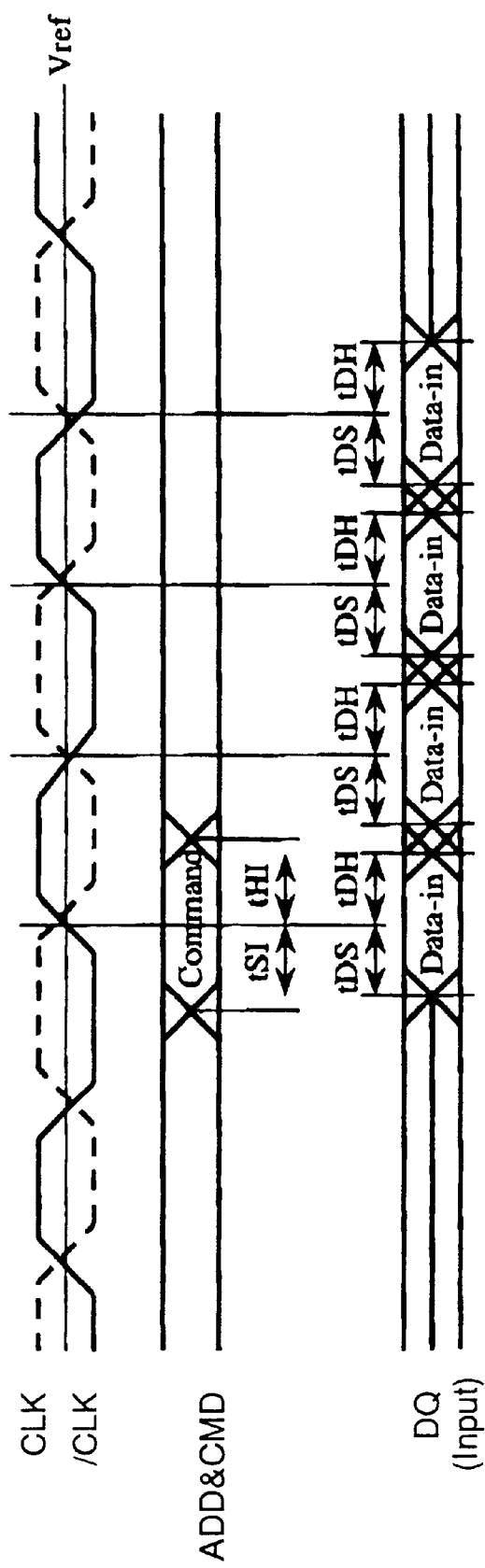
FIG. 9 is a timing chart of a data write operation of the configuration shown in FIG. 5.

FIG. 9 shows a specification of the signals involved in the write operation of the memory 210. For the sake of convenience, the write command and the first write data are illustrated on the same time axis. In FIG. 9, "tSI" denotes an input setup time, and "tHI" denotes an input hold time. Also, "tDS" denotes a data input setup time, and "tDH" denotes a data input hold time.

The write operation of the memory 210 uses the clocks CLK and /CLK from the controller 110 as the strobe signals for the write data, address (AD) and command (CMD). In addition to this feature, the reference point for defining the input setup time tSI, the input hold time tHI, the data input setup time tDS and the data input hold time tDH is defined by a reference voltage Vref.

A description will be given of a technical contribution brought when the clocks CLK and /CLK from the controller 110 are used as the data, address and command strobe signals. In the conventional art, the write data is written into the memory in synchronism with the data strobe signal DQS, and the address and command are acquired in the memory in synchronism with the clocks CLK and /CLK. Hence, the write operation is initiated by the clocks serving as a trigger, while write data is acquired in the memory by the data strobe signal DQS serving as a trigger. If the clocks CLK and /CLK and the data strobe signal DQS do not deviate from each other greatly due to a difference between the load of the clock line and that of the data strobe line, the timing at which data is written into a core circuit of the memory is not different from the timing at which write data becomes available. Thus, the write operation can duly be performed.

However, if a higher operating frequency is selected and a higher clock frequency is thus used, a time deviation from the clocks CLK, /CLK to the data strobe signal DQS becomes great, as compared to one clock of the clocks CLK and /CLK. In an extreme case, the time deviation is greater than one clock. As the write operation becomes faster, the write operation is affected by the difference between the timing of the write operation and the timing of receipt of write data due to the difference between the clocks CLK, /CLK and the data strobe signal DQS.

In contrast, according to the present invention, the above-mentioned problems of the conventional art can be overcome because the clocks CLK and /CLK are used as the strobe signals for all the write data, address and command.

A description will be given of a technical contribution resulting from the unique arrangement in which the reference voltage Vref is used to define the reference point for defining the input setup time tSI, input hold time tHI, data input setup time tDS and data input hold time tDH. In the conventional art, the address and command are handled using the reference point which corresponds to the cross point at which the clocks CLK and /CLK cross each other, while the write data is compared with the reference voltage Vref which serves as a reference point for the data strobe signal DQS. The setup time and the hold time are selected so as to include respective, different additional times, taking into account a situation in which, if the temperature condition or power supply voltage condition changes, the reference point for the clocks CLK, /CLK and the reference point for the data strobe signal DQS will change in different manners.

In contrast, according to the present invention, as shown in FIG. 9, the reference point (in other words, the setup time and the hold time) is defined by the cross point in which the rising edge of the clock CLK or /CLK crosses the reference voltage Vref, and the write data, address and command are received using the reference point thus defined. Hence, it is not required to include the additional times in the setup time and the hold times. According to the present invention, it is possible to select the parameter values so that tSI=tHI=tDS=tDH.

FIGS. 10A and 10B show examples of the data read operation of the memory 210. The operation shown in FIG. 10B is faster than that shown in FIG. 10A. It can be seen from FIGS. 10A and 10B that, as the frequency of the clocks CLK and /CLK becomes higher, the data settlement width (settlement period) is stable although the data settlement width merely becomes narrower correspondingly.

FIGS. 11A and 11B show examples of the data write operation of the memory 210. The operation shown in FIG. 11B is faster than that shown in FIG. 11A. It can be seen from FIGS. 11A and 11B that, as the frequency of the clocks CLK and /CLK becomes higher, the data settlement width (settlement period) is stable although the data settlement width merely becomes narrower correspondingly.

In the configuration shown in FIG. 6, the output strobe signal /QCLK is generated by merely buffering the clock CLK by the buffer circuit 212. Although not illustrated, the output strobe signal QCLK is generated by merely buffering the clock signal /CLK. Simple buffering may need a long time to detect the phase difference φ shown in FIG. 6 if the temperature condition and/or the power supply voltage condition changes. With the above in mind, it is required to design the detection of the phase difference φ shown in FIG. 6 taking into consideration the temperature condition and the power supply voltage condition changes.

Figure 12:
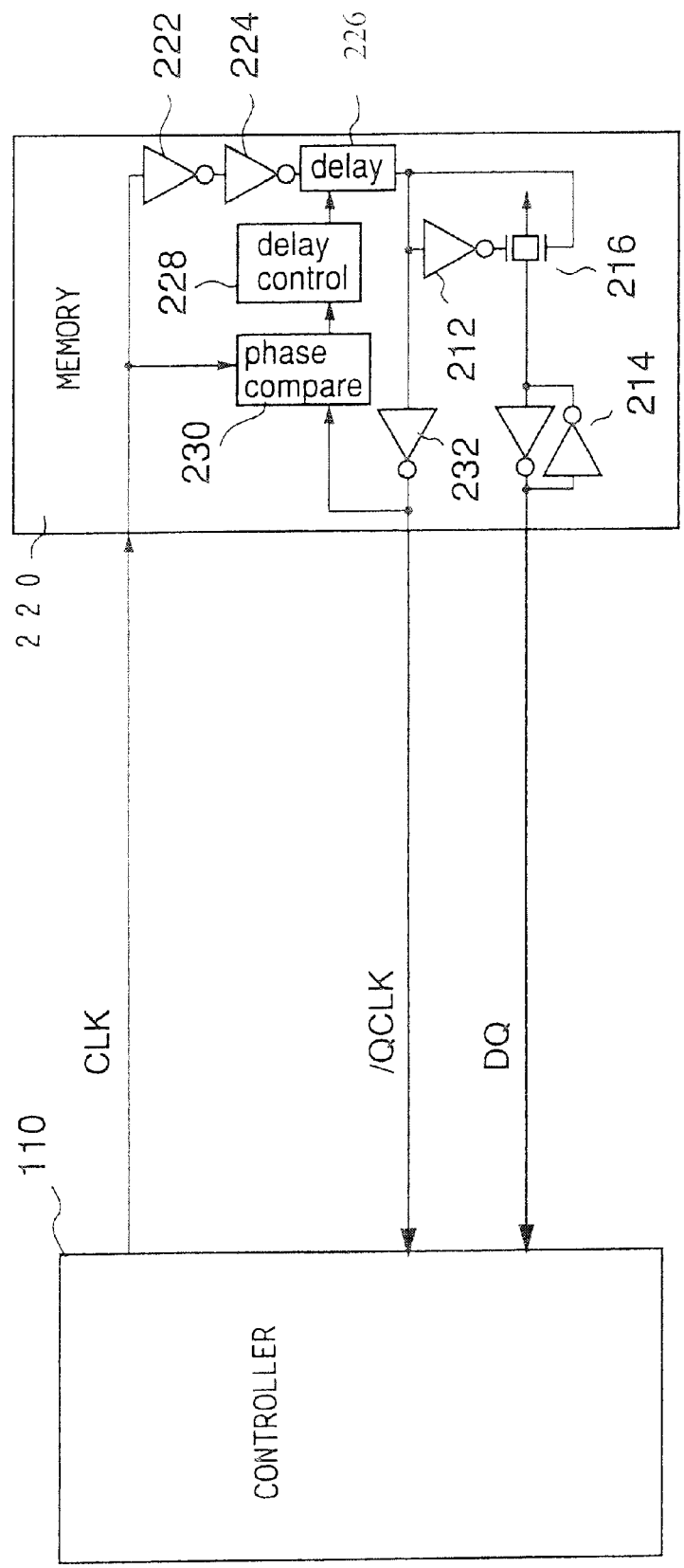
FIG. 12 is a block diagram of a circuit in which a DLL circuit is used to generate an output strobe signal /QCLK from clock CLK.

FIG. 12 is a block diagram of a modified memory 220 designed taking into consideration a change of the temperature condition and the power supply voltage condition.

The memory 220 uses a DLL (Delayed Lock Loop) circuit in order to generate the output strobe signal /QCLK from the clock CLK. The DLL circuit is made up of inverters 222, 224 and 232, a delay circuit 226, a delay controller 228, and a phase comparator 230. The clock CLK passes through the inverters 222, 224, the delay circuit 226 and the inverter 232, and is output to the controller 110 as the output strobe signal /QCLK. The phase comparator 230 compares the phase of the clock CLK with the phase of the output strobe signal /QCLK and thus detects a phase difference. The delay controller 228 is controlled based on the above phase difference. More particularly, the delay controller 228 varies the delay amount of the delay circuit 226 in such a manner that the phase difference is always constant. Thus, the phase of the output strobe signal /QCLK is controlled to have a constant phase difference with respect to the phase of the clock CLK, even if there is a change in the temperature condition and/or the power supply voltage condition. Thus, the detection of the phase difference by the controller 110 can be facilitated.

Figure 13:
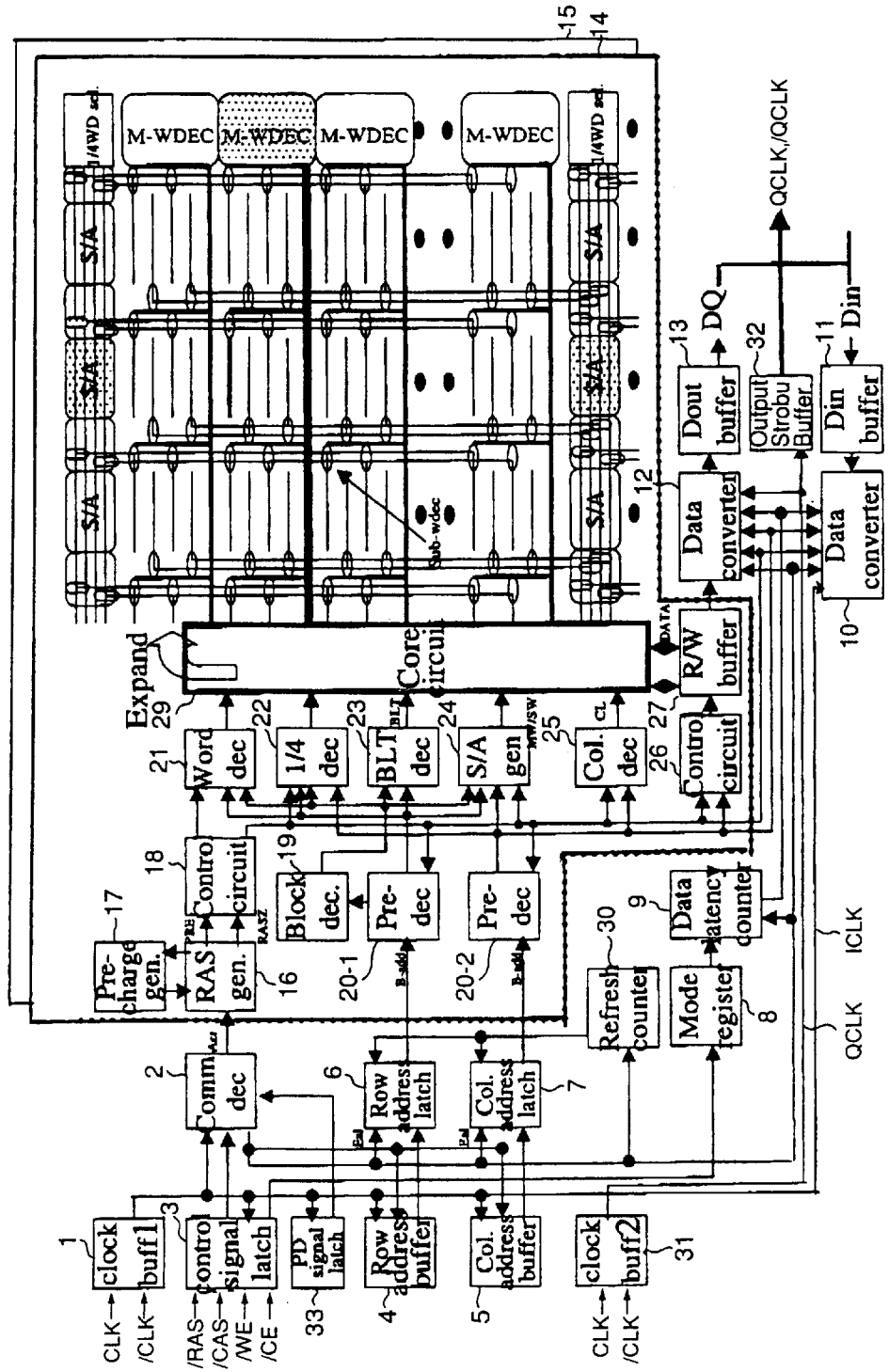
FIG. 13 is a block diagram of the overall structure of a semiconductor memory device according to an embodiment of the present invention.

FIG. 13 is a block diagram of the overall configuration of a DDR-SDRAM which is one type of the semiconductor device according to an embodiment of the present invention. The configuration shown in FIG. 13 includes two banks, but one or three or more banks may be used.

As shown in FIG. 13, the DDR-SDRAM includes a first clock buffer 1, a second clock buffer 31, a command decoder 2, a control signal buffer 3, a row address buffer 4, a column address buffer 5, address latches 6 and 7, a mode register 8, a data latency counter 9, data converters 10 and 12, a data input buffer 11, a data output buffer 13, a bank (0) circuit 14, and a bank (1) circuit 15. Each of the bank (0) circuit 14 and the bank (1) circuit 15 includes memory cell blocks each having memory cells arranged in a matrix formation, a RAS (Row Address Strobe) signal generating unit 16, a PRE (precharge) signal generating circuit 17, a control unit 18, a block decoder 19, predecoders 20-1 and 20-2, a word decoder 21, a 1/4 decoder 22, a BLT (bit line transfer) decoder 23, an S/A (sense amplifier) control signal generating unit 24, a column decoder 25, a control unit 26, a read/write buffer 27, a refresh counter 28, a core circuit 29, an output strobe buffer 32, and a PD signal latch 33.

The following are unique arrangements in the configuration shown in FIG. 13.

In addition to the clock buffer 1 used in the conventional DDR-SDRAM, the configuration shown in FIG. 13 is newly equipped with the second clock buffer 31. Hereinafter, the clock buffer is referred to as first clock buffer 1. The first clock buffer 1 includes a DLL circuit, which generates input-side internal clocks ICLK and /ICLK from the clocks CLK and /CLK externally supplied from the outside of the device shown in FIG. 13. For the sake of simplicity, FIG. 13 illustrates ICLK only. The second clock buffer 31 includes, among the parts of the DLL circuit shown in FIG. 12, the inverters 222 and 224, the delay circuit 226, the delay cotnroller 228 and the phase comparator 230. The output strobe buffer 32 includes, among the parts of the DLL circuit shown in FIG. 12, the inverter 232.

Although not illustrated for the sake of simplicity of illustration of FIG. 13, there is provided a signal line which connects the output of the inverter 232 to the phase comparator 230 in the second clock buffer 31. The output signal of the delay circuit 226 is supplied, as an output-side internal clock OCLK, to the output strobe buffer 32 from the second clock buffer 31. The above configuration is provided for each of the clocks CLK and /CLK. That is, an output-side internal clock /OCLK is supplied from the second clock buffer 31. For the sake of simplicity of illustration, the output-side internal clock /OCLK is omitted from FIG. 13.

The output strobe buffer 32 inverts the output-side internal clocks OCLK and /OCLK supplied from the second clock buffer 31 and thus generates the output strobe signals QCLK and /QCLK.

As described above, the internal clocks are separately provided on the input and output sides. Thus, the data converter (serial-to-parallel converter) 10 on the data input side operates in synchronism with the input-side internal clocks ICLK and /ICLK, and the data converter (parellel-to-serial converter) 12 on the data output side operates in synchronism with the output-side internal clocks OCLK and /OCLK.

The reference point of the first clock buffer 1 is the reference voltage Vref (see FIG. 9), and the reference point of the second clock buffer 31 is a cross point Vx (see FIG. 8).

Figure 14:
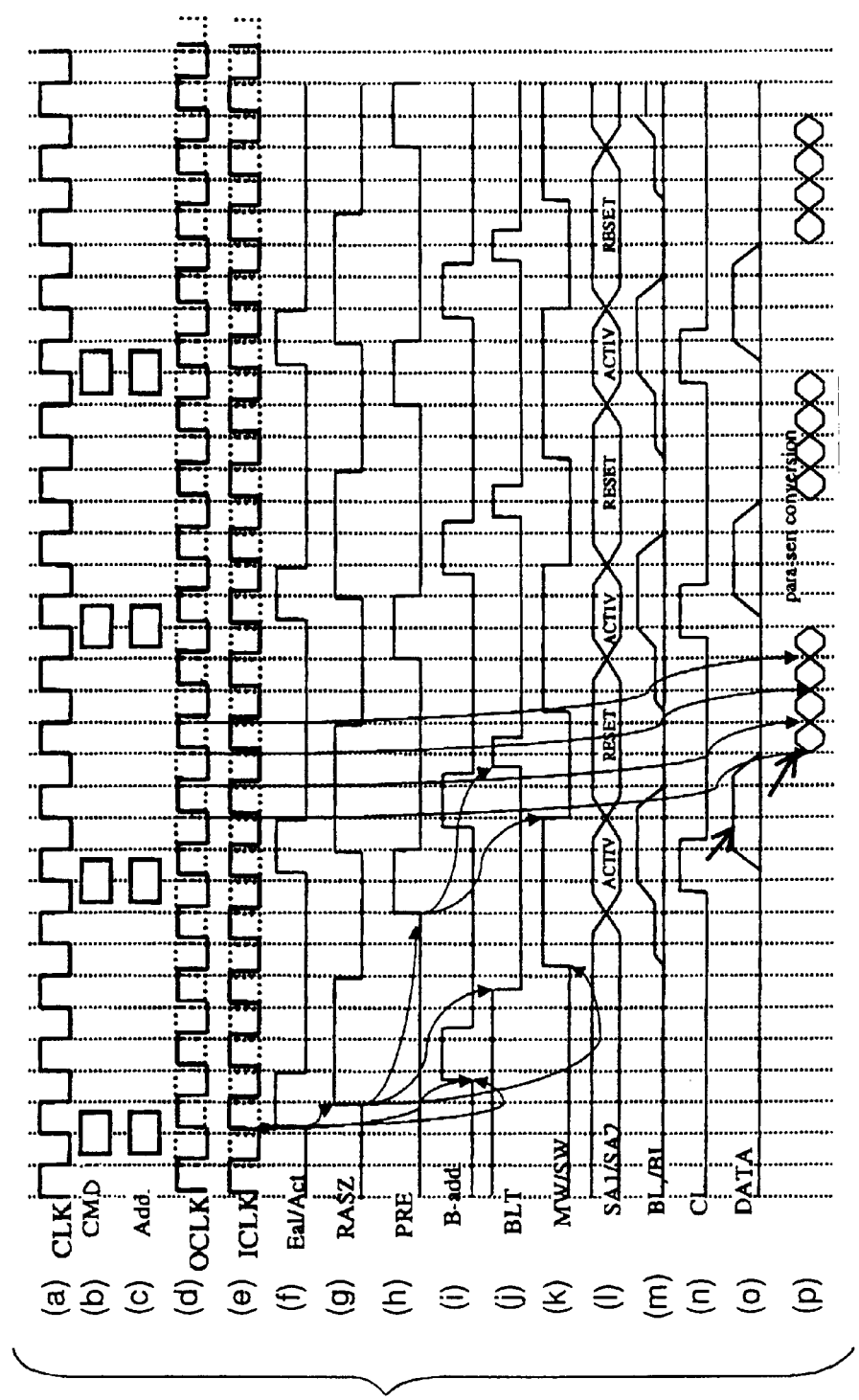
FIG. 14 is a timing chart of an operation of the device shown in FIG. 13.

The parts of the DDR-SDRAM shown in FIG. 13 will be described with reference to FIG. 14, which is a timing chart of an operation of the DDR-SDRAM. The waveforms with symbols shown in FIG. 14 are those of signals obtained at points or nodes assigned the same symbols.

The control buffer 3 latches a row address strobe signal RAS, a column address strobe signal /CAS, a write enable signal /WE, and a chip enable signal /CE, and sends these signals to the command decoder 2 (FIG. 14(b)). It is to be noted that a symbol "/" denotes an active-low logic.

The command decoder 2 decodes the signals supplied from the control signal buffer 3, and sends these signals to the bank (0) circuit 14, the bank (1) circuit 15, the address latches 6 and 7, and the data latency counter 9 (FIG. 14(f)). The row address buffer 4 and the column address buffer 5 are supplied from an external address signal (A0–An, B0–Bn; FIG. 14(c)), and supplies associated address signals to the address latches 6 and 7. The variable "n" is an integer based on the memory capacity.

The address latches 6 and 7 respectively latch the row address and the column address, and output the latched addresses to the predecoders 20-1 and 20-2 (FIG. 14(i)).

The mode register includes burst-length information used. As has been described previously, the data write operation uses the clocks CLK and /CLK as the strobe signals. Thus, the write timing is defined with respect to the write command. The data latency counter 9 measure time based on the burst-length information supplied from the mode register 8. The data converter 10 receives external serial data via the data input buffer 11, and converts the received serial data into parallel data, which is then supplied to the read/write buffer 27. The data converter 12 receives parallel data from the read/write buffer 27, and converts the received parallel data into serial data, which is then output to the outside of the device. The data converters 10 and 12 operate at appropriate timings based on the signal supplied from the data latency counter 9.

In the embodiment of the present invention shown in FIG. 13, input pins or terminals and output pins or terminals are commonly used. In other words, an I/O common type interface is used to establish an interface with the outside of the device. Alternatively, it is possible to employ an I/O separate type interface in which input pins and output pins are provided separately.

A description will now be given the structure and function of each bank selected by the row address buffer 4 and the column address buffer 5. Here, only the bank (0) circuit 14 illustrated in FIG. 13 will be explained.

In the bank (0) circuit 14, the RAS signal generating unit 16 generates a signal RASZ, which instructs data in memory cells in the memory blocks to be read by associated sense amplifiers (FIG. 14(g)). The PRE signal generating unit 17 receives the signal RASZ which is an internal RAS signal, and generates a precharge signal PRE when a given time elapses after receipt of the signal RASZ (FIG. 14(h)). The precharge signal PRE internally generated resets the RAS signal generating unit 16 so that precharge operation is performed as in a case where the precharge signal PRE is supplied from the outside of the device. The precharge operation responsive to the precharge signal PRE generated within the device is self-precharge.

The predecoder 20-1 predecodes the row address signal supplied from the address latch 6. The result of predecoding is supplied to the block decoder 19, and to the word decoder 21, the 1/4 decoder 22, the BLT decoder 23, and the S/A drive signal generating unit 24.

The block decoder 19 selects one of the memory blocks arranged in the DDR-SDRAM. In only the selected memory block, the word decoder 21, the 1/4 decoder 22, the BLT decoder 23, and the S/A drive signal generating unit 24 operate, and data are read from the memory cells in the core circuit 29 and are stored in the sense amplifiers.

The core circuit 29 includes a large number of memory cells arrayed in a matrix formation, and the sense amplifiers are provided to the respective columns. Data in memory cells related to word lines selected by the row address signal in the read operation responsive to the above-mentioned row address signal are stored in the sense amplifiers (FIG. 14(m)).

The predecoder 20-2 predecodes the column address signal supplied from the address latch 7. The result of predecoding is supplied to the column decoder 25, and to the 1/4 decoder 22, the S/A drive signal generating unit 24, and the control circuit 26. The column decoder 25 supplies a column line select signal CL to a column specified by the column address signal (FIG. 14(n)). The data read from the column is stored in the read/write buffer 27.

The word decoder 21 generates the word line select signal based on the control of the control unit 18 (FIG. 14(k)). The 1/4 decoder 22 selects one sub word decoder from among four sub word decoders associated with a selected main word decoder in a hierarchical word decode fashion. The BLT decoder 23 generates a bit line transfer signal based on the control unit 18 (FIG. 14(j)). The S/A drive signal generating unit 24 generates sense amplifier drive signals SA1 and SA2 based on the control of the control unit 18 (FIG. 14(l)).

The control unit 26 controls the read/write buffer 27 based on the signals supplied from the address latches 6 and 7, and controls the data read/write operations. At the time of the write command, the control unit 26 supplies data stored in the read/write buffer 27 to the core circuit 29. At the time of the read command, the control unit 26 reads data from the sense amplifiers, and supplies the data thus read to the read/write buffer 27 and the data converter 12 (FIG. 14(o)). The data converter 12 operates in synchronism with the output-side internal clock OCLK (FIG. 14(p)).

Figure 15:
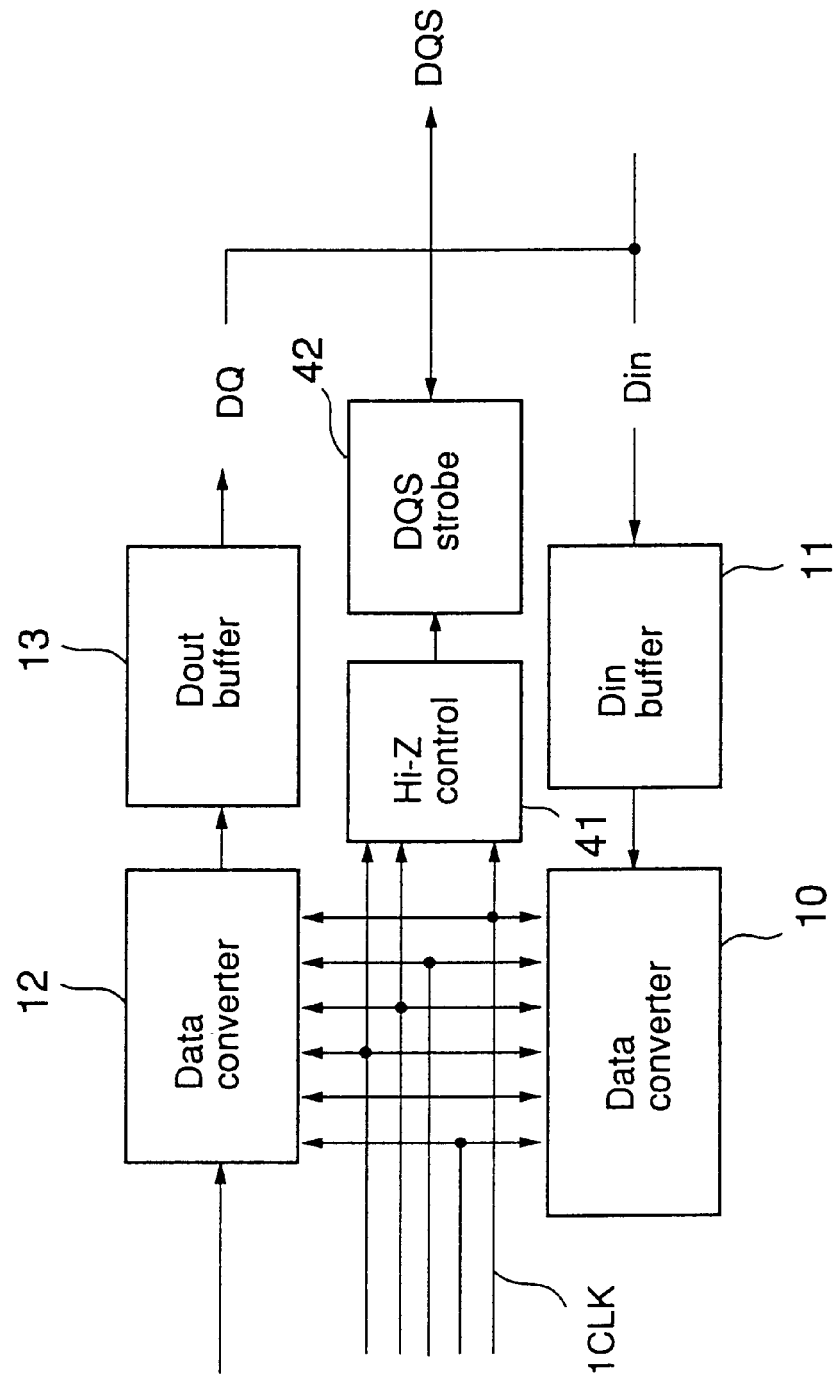
FIG. 15 is a block diagram of a conventional data input/output part.

FIG. 15 is a block diagram of an input/output section of the conventional DDL-SDRAM. The configuration shown in FIG. 13 differs from that shown in FIG. 15 in the following. Conventionally, a controller 41 is needed to control a data bus strobe signal line to the high-impedance state via a DQS strobe buffer 42. In contrast, the present invention does not need the controller 41 or the like. Conventionally, the data converters 10 and 12 operate in response to an internal clock like the internal clock supplied from the clock buffer 1 shown in FIG. 13. In contrast, according to the present invention, the data converters 10 and 12 operate in synchronism with the respective, different clocks OCLK and ICLK.

According to the present invention, the output strobe signal for outputting data is generated in the memory device from the clock supplied from the outside of the memory device. Thus, there is no need to define the preamble period and the control to set the strobe signal line to the high-impedance state.

The present invention is not limited to the specifically disclosed embodiments, and variations and modifications may be made without departing from the scope of the present invention.

What is claimed is:

1. A semiconductor integrated circuit device which operates in synchronism with an external clock, the device comprising:

a first circuit to generate, from said external clock, an output strobe signal for outputting data from the device, and to output the output strobe signal, said external clock including complementary clock components, wherein receipt of input data, a command and an address are responsive to a cross point where the complementary clock components of said external clock cross a reference voltage.

2. The semiconductor integrated circuit device as claimed in claim 1, wherein said first circuit comprises a buffer circuit which buffers the clock, and a buffered clock is the output strobe signal.

3. The semiconductor integrated circuit device as claimed in claim 1, wherein said first circuit comprises a delayed lock loop circuit which controls the clock and the output strobe signal so as to have a given phase difference therebetween.

4. The semiconductor integrated circuit device as claimed in claim 1, wherein the output strobe signal includes complementary components.

5. The semiconductor integrated circuit device as claimed in claim 1, wherein:

the output strobe signal includes complementary components; and a cross point of the complementary components of the output strobe signal defines a settlement period for output data.

6. The semiconductor integrated circuit device as claimed in claim 1, further comprising:

a second circuit which buffers the external clock and outputs a buffered clock as a strobe signal for input data.

7. A semiconductor memory device comprising:

a memory part;

a clock receiving part to receive external complementary clocks; and a first circuit to generate, from said external complementary clocks, complementary output strobe signals for outputting data stored in the memory part, and to output the complementary output strobe signals, wherein receipt of input data, a command and an address are responsive to a cross point where said external complementary clocks cross a reference voltage.

8. The semiconductor memory device as claimed in claim 7, wherein said first circuit comprises a buffer circuit which buffers the complementary clocks and outputs buffered complementary clocks as the complementary output strobe signals.

9. The semiconductor memory device as claimed in claim 7, wherein said first circuit comprises a delayed lock loop circuit which controls the complementary clocks and the complementary output strobe signals so as to have a given phase difference therebetween.

10. A system comprising:
   a controller to output complementary clocks; and
   a memory device coupled to the controller,
   said memory device comprising:
      a memory part;
      a clock receiving part to receive the complementary clocks; and
      a first circuit to generate, from said complementary clocks, complementary output strobe signals for outputting data stored in the memory part, and to output the complementary output strobe signals to the controller,
      wherein receipt of input data, a command and an address are responsive to a cross point where said complementary clocks cross a reference voltage.

11. The system as claimed in claim 10, wherein said first circuit comprises a buffer circuit which buffers the complementary clocks and outputs buffered complementary clocks as the complementary output strobe signals.

12. The system as claimed in claim 10, wherein said first circuit comprises a delayed lock loop circuit which controls the complementary clocks and the complementary output strobe signals so as to have a given phase difference therebetween.

* * * * *